(12) United States Patent
Yang

(10) Patent No.: US 11,551,773 B2
(45) Date of Patent: Jan. 10, 2023

(54) METHOD OF TESTING WITH GROUND NOISE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/643,188

(22) Filed: Dec. 8, 2021

(65) Prior Publication Data

US 2022/0101935 A1    Mar. 31, 2022

Related U.S. Application Data

(62) Division of application No. 16/939,047, filed on Jul. 26, 2020, now Pat. No. 11,250,925.

(51) Int. Cl.
*G11C 7/00* (2006.01)
*G11C 29/12* (2006.01)
*G11C 16/26* (2006.01)

(52) U.S. Cl.
CPC ........ *G11C 29/12005* (2013.01); *G11C 16/26* (2013.01)

(58) Field of Classification Search
CPC ....... G11C 29/50; G11C 11/401; G11C 29/02; G11C 29/34; H01K 999/99

USPC ......................................................... 365/201
See application file for complete search history.

(56) References Cited

U.S. PATENT DOCUMENTS

| | | | |
|---|---|---|---|
| 6,429,676 B1 * | 8/2002 | Chun | G01R 31/3161 324/762.02 |
| 6,674,677 B2 | 1/2004 | Harrington et al. | |
| 7,518,424 B2 | 4/2009 | Yeh | |
| 8,461,858 B1 * | 6/2013 | Singh | G01R 31/31721 324/762.01 |
| 10,127,127 B2 | 11/2018 | Dashtipour et al. | |
| 10,666,044 B2 | 5/2020 | Yamaguchi | |

* cited by examiner

*Primary Examiner* — Son T Dinh
(74) *Attorney, Agent, or Firm* — CKC & Partners Co., LLC

(57) ABSTRACT

The present disclosure provides a method of testing a testing device with a ground noise. The method includes coupling a device under test in series between a source and a ground in an automatic test equipment, coupling a ground bounce generator in series between the device under test and the ground, coupling the testing device to the device under test, providing a current by the source through the device under test and the ground bounce generator, controlling the ground bounce generator to generate the ground noise, and collecting a performance result of the testing device in the automatic test equipment.

11 Claims, 6 Drawing Sheets

METHOD OF TESTING WITH GROUND NOISE

CROSS-REFERENCE TO RELATED APPLICATION

The present application is a Divisional Application of the U.S. application Ser. No. 16/939,047, filed Jul. 26, 2020, which is herein incorporated by reference in its entirety.

BACKGROUND

Field of Invention

The present invention relates to the ground bounce generator. More particularly, the present invention relates to the method of testing a device with the ground bounce generator for generating the ground noise.

Description of Related Art

An automatic test equipment (ATE) is generally used in the device development to test the performance of the device, for example, a dynamic random accessory memory (DRAM). A platform is a component of the ATE, and a device under test (DUT) is designed on the platform for placement of the testing device. The purpose of the ATE is to simulate a real application environment for the testing device and screen out the cases of disqualification.

SUMMARY

The invention provides a method of testing a testing device with a ground noise. The method includes coupling a device under test in series between a source and a ground, coupling a ground bounce generator in series between the device under test and the ground, coupling a testing device to the device under test, providing a current by the source through the device under test and the ground bounce generator, controlling the ground bounce generator to generate the ground noise, and collecting a performance result of the testing device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
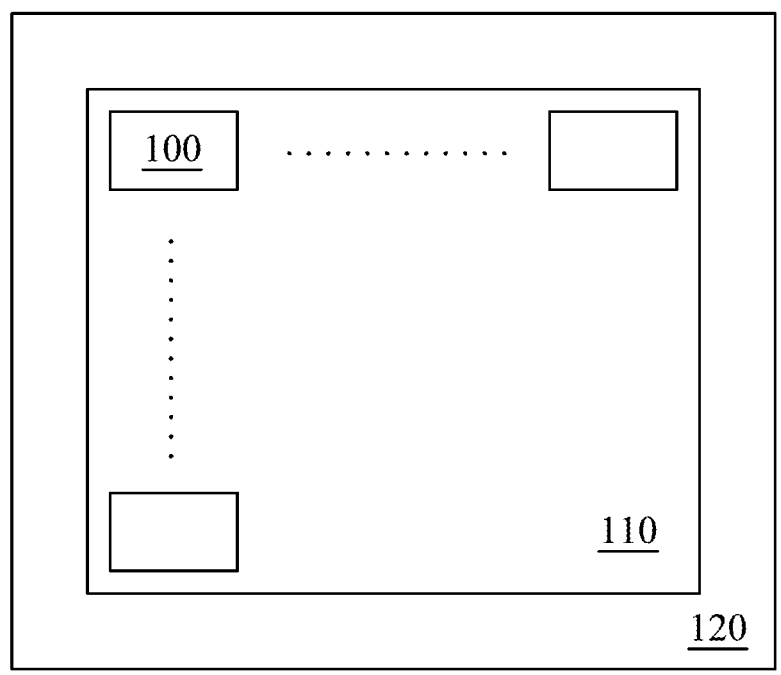
FIG. 1A is a schematic block view of an automatic test equipment with a plurality of device under tests according to some embodiments.

Reference will now be made in detail to the present embodiments of the invention, examples of which are illustrated in the accompanying drawings. Wherever possible, the same reference numbers are used in the drawings and the description to refer to the same or like parts.

FIG. 1A illustrates a schematic block view of an automatic test equipment (ATE) in accordance with some embodiments of the present disclosure. As shown in FIG. 1A, an ATE 120 may include a platform 110 which is designed as a part of a jig. A plurality of device under tests (DUT) 100 may be arranged in the platform 110 for the placement of testing devices, for example, dynamic random accessory memories (DRAM). The number and the arrangement of the DUT 100 may be any suitable design to meet the purpose of device quality test, and those modifications are within the scope of the present disclosure.

Figure 1B:
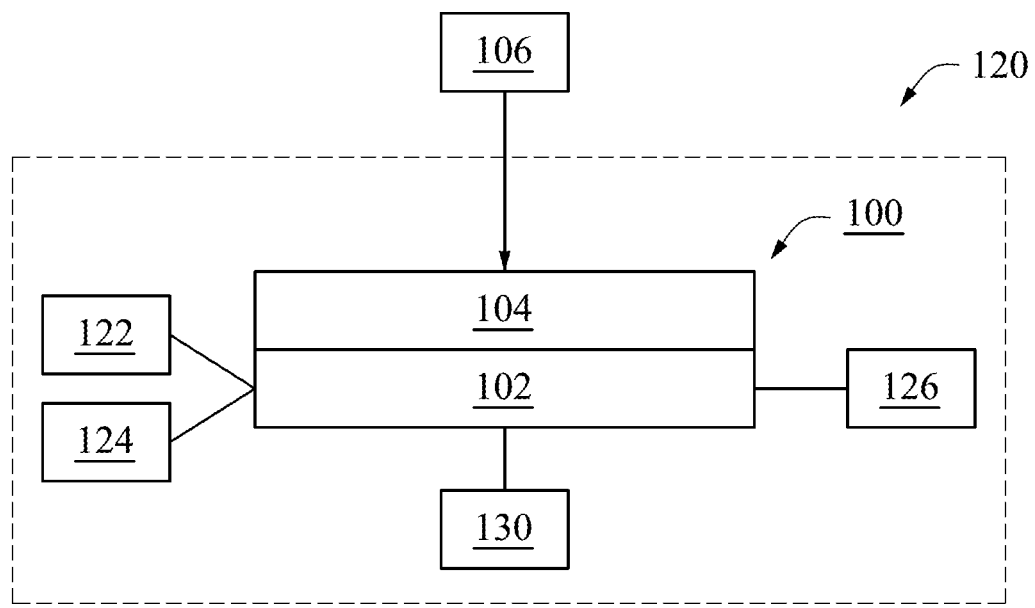
FIG. 1B is a schematic block view of a device under test in an automatic test equipment according to some embodiments.

FIG. 1B illustrates a schematic block view of a DUT 100 related to FIG. 1A in accordance with some embodiments of the present disclosure. In FIG. 1B, the DUT 100 includes a printed circuit board (PCB) 102 and a socket 104 on the PCB 102. The PCB 102 may be designed to contain circuits for different purposes which include power supply, data transmission, or the like. As shown in FIG. 1B, the PCB 102 may be connected to lines such as an address input 122, a control input 124, or a data input/output 126 in the ATE 120. Therefore, additional tester components may be added in the PCB 102, such as the following described ground bounce generator of the present disclosure. The socket 104 may be connected to the PCB 102, which becomes the connector between the PCB 102 and the testing device 106. When a current is provided to the DUT 100, the ATE 120 works to simulate an application environment and collects a performance result of the testing device 106 by a processor 130 connecting to the DUT 100. As designed as the above mentioned, the ATE 120 is able to perform various tests on the testing device 106 by the PCB 102 and the socket 104 of the DUT 100 and examine the product quality. In some embodiments, there may be other layers or devices included in the DUT 100 or the ATE 120, and those modifications are within the scope of the present disclosure.

Figure 2:
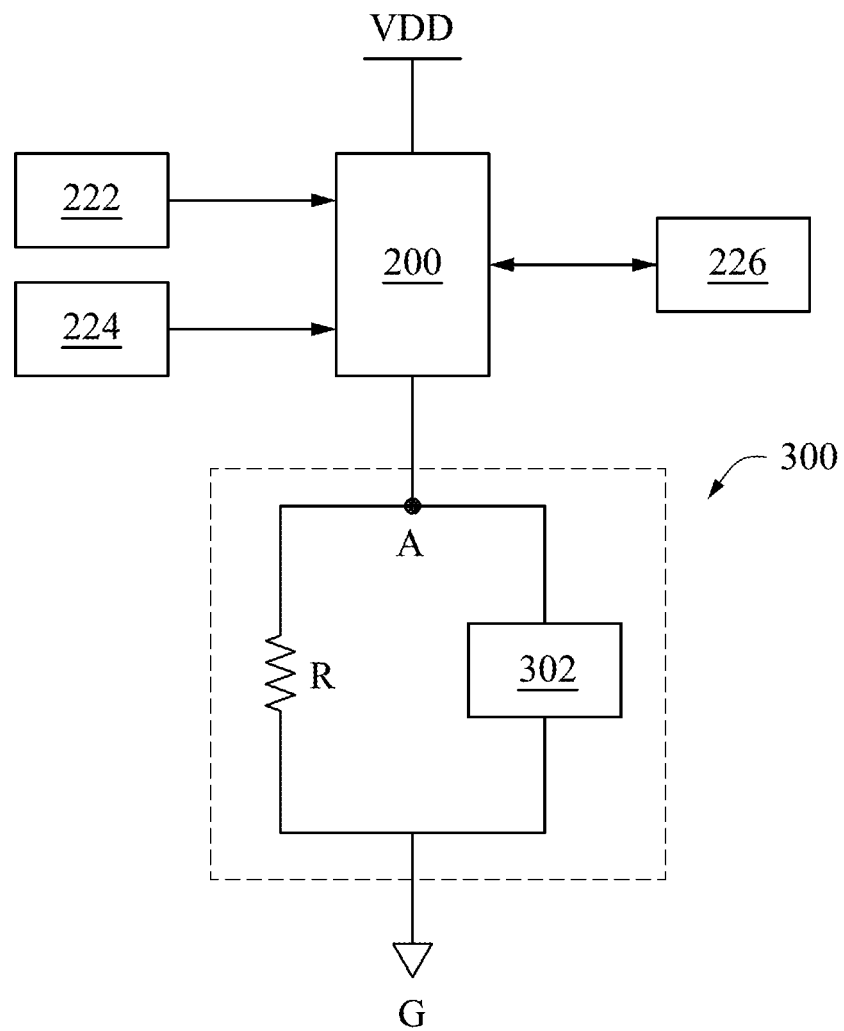
FIG. 2 is a schematic diagram of a circuit including a device under test and a ground bounce generator according to some embodiments of the present disclosure.

The purpose of an ATE is to simulate an application environment close to the real life. For example, a ground noise exists in real application of devices, and a commercial device should have resistance to the ground noise. In other words, an ATE with the ability to generate the ground noise to the DUT is preferable for the device performance test. Therefore, a ground bounce generator is disclosed herein to generate artificial and controllable ground noise which occurs in the real life. FIG. 2 illustrates a schematic diagram of a circuit including a DUT and a ground bounce generator in accordance with some embodiments of the present disclosure. As shown in FIG. 2, the illustrated DUT is a DUT 200 which is similar to the DUT 100 of FIGS. 1A-1B. However, the DUT included in the circuit of FIG. 2 and the other circuits mentioned in the following description may be the DUT 200 or any other suitable DUT. The DUT 200 may be coupled in serious between a source VDD and a ground G. The source VDD and the ground G may provide power to the DUT 200 to simulate a working condition for testing devices. In addition, the DUT 200 may be connected to other lines including, but not limited to, address input 222, control input 224, and data input/output 226 similar to those in FIG. 1B to provide signals for device performance test in an ATE. In some embodiments, there may be other lines or devices connected to the DUT 200, and those modifications are within the scope of the present disclosure.

A ground bounce generator 300 may be coupled in series between the DUT 200 and the ground G to generate ground noise to the DUT 200. Referring to FIG. 1B and FIG. 2, in some embodiments, the ground bounce generator 300 may be added into the PCB 102 of the DUT 100 and thus coupled in series with the socket 104. However, for clarity of discussion, the ground bounce generator 300 is illustrated as a component separated from the DUT 200 in FIG. 2. In some embodiments, the ground bounce generator 300 may be positioned at different places in an ATE, and those modifications are within the scope of the present disclosure.

In some embodiments, the ground bounce generator 300 may include a resistor R and a switch 302 coupling in parallel. In some embodiments, the switch 302 may have a relay controlled by the ATE. The switch 302 may be controlled by other ways or elements of the ATE, and those modifications are within the scope of the present disclosure. When the switch 302 is turned "on" and forms a closed circuit on the switch 302, the current from the source VDD passes through the DUT 200 and the switch 302. As a result, the DUT 200 is directly connected to the ground G and the voltage from the source VDD may be mainly provided to the DUT 200. In this case, the ground noise may be regarded as the smallest during the operation of the ATE. When the switch 302 is turned "off" and the switch 302 forms an open circuit, the current from the source VDD passes through the DUT 200 and the resistor R, which generates a voltage drop across the resistor R. Therefore, the voltage from the source VDD may be shared by the DUT 200 and the resistor R. The voltage drop may be considered as the largest ground noise provided to the DUT 200 by the ground bounce generator 300. The ATE having the ground bounce generator 300 may be able to generate a group of artificial ground noises while repeating turning the switch 302 on and off.

In one embodiment, for example, the source VDD totally provides 1.2 V, and the current through the DUT 200 is 300 mA. When the switch 302 is turned on, the voltage on the DUT 200 is 1.2 V, and the voltage at point A is 0 V in the circuit of FIG. 2. When the switch 302 is turned off, a voltage drop occurs across the resistor R. As the resistor R is 1Ω, the voltage at point A equals to 0.3 V according to Ohm's law, and the voltage on the DUT 200 correspondly decreases to 0.9 V. According to the above embodiment, the ATE may repeat turning on and off the switch 302 and generate a ground noise with a maximum amplitude of 0.3 V to the DUT 200. The values in the above mentioned embodiment are only exemplary, and they may be any suitable values for device performance tests.

Figure 3A:
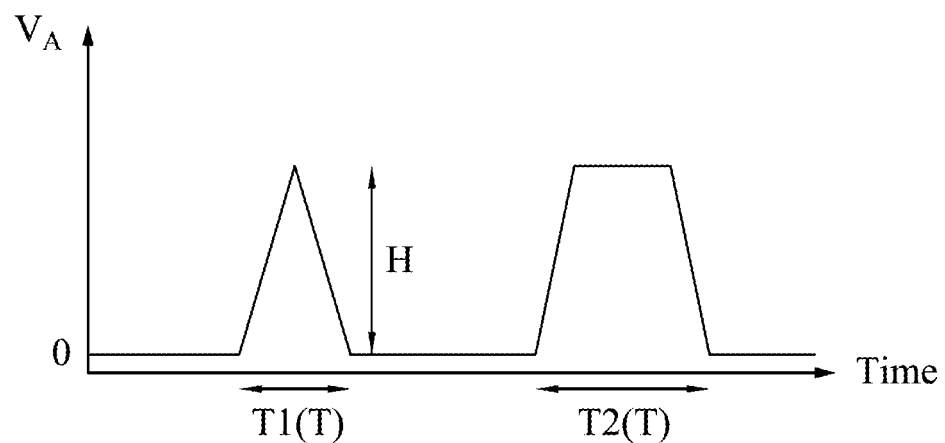
FIGS. 3A-3B are line graphs of time dependent voltage $V_A$ and $V_{DUT}$, respectively, in the circuit of FIG. 2.

The ground noise may be illustrated as a line graph for clearer discussion. FIG. 3A illustrates a time dependent voltage $V_A$ at point A in the circuit of FIG. 2. Referring to FIG. 2 and FIG. 3A, the rise and the drop of voltage $V_A$ respectively correspond to the off and on of the switch 302, which lead to the peaks shown in FIG. 3A. The maximum amplitude of the peaks is regarded as an amplitude H. The amplitude H of the peaks may be determined by the resistor R. If the resistor R is larger, the amplitude H (or the voltage drop across the resistor R) also becomes larger. In some embodiments, the resistor R may be selected to generate the amplitude H larger than 50 mV so that the ground noise is not neglected. In some embodiments, the resistor R may be selected to generate the amplitude H larger than 300 mV since the real ground noise is generally larger than 300 mV. In some embodiments, the resistor R may be selected to generate the amplitude H with 10% to 30% of the voltage provided by the source VDD. The amplitude H smaller than 10% of the voltage of the source VDD may be too small to simulate the real ground noise, while the amplitude H larger than 30% of the voltage of the source VDD may affect the testing devices much more seriously than the real application. In some embodiments, the ratio of the amplitude H to the voltage provided to the DUT may include other values, and those modifications are within the scope of the present disclosure. In addition, the retention time of the peaks is regarded as a period T. The period T is determined by the switch 302 controlled by the ATE. In some embodiments, the period T may remain the same during the operation of the ATE, which indicates that the ground noise frequency generated by ground bounce generator is consistent and regular. In some other embodiments, the period T may vary during the operation of ATE, as shown as a period T1 and a period T2 in FIG. 3A, which leads to the irregular ground noise frequency.

Figure 3B:
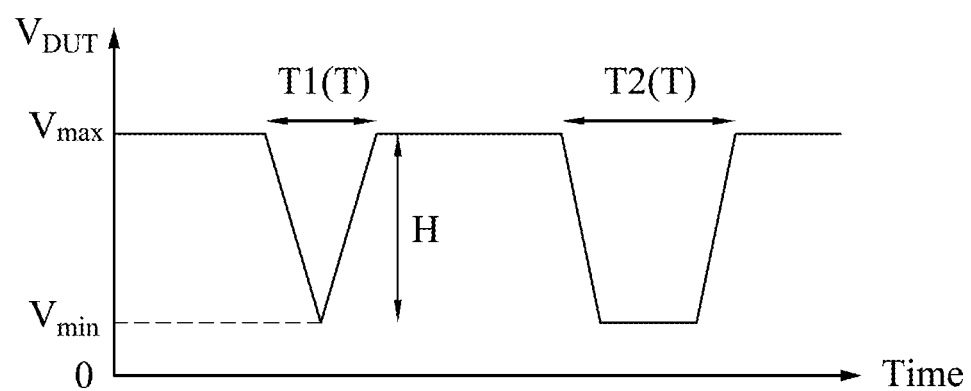

FIG. 3B illustrates a time dependent voltage $V_{DUT}$ on the DUT 200 in the circuit of FIG. 2. Referring to FIGS. 2, 3A, and 3B, the voltage $V_A$ in FIG. 3A may lead to corresponding changes of the voltage $V_{DUT}$ in FIG. 3B. When the voltage $V_A$ increases, the voltage $V_{DUT}$ correspondly decreases, and vice versa. In some embodiments which the voltage provided by the source VDD is not consumed by other components, the sum of the voltage $V_A$ and the voltage $V_{DUT}$ equals to the voltage of the source VDD. In some other embodiments, the amplitude H of the voltage $V_A$ equals to the drop of the voltage $V_{DUT}$. As shown in FIGS. 3A and 3B, the amplitude of the voltage $V_{DUT}$ varies between an amplitude $V_{max}$ and an amplitude $V_{min}$, and the sum of the amplitude $V_{min}$ and the amplitude H in FIG. 3A equals to the amplitude $V_{max}$. The retention times of the peaks of the voltage $V_{DUT}$ also correspond to those of the voltage $V_A$, as shown as the period T1 and T2.

Figure 4:
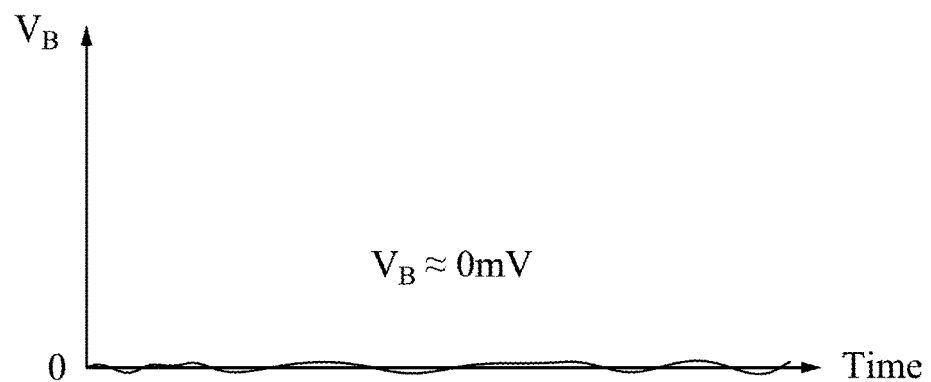
FIG. 4 is a line graph of a time dependent voltage $V_B$ in the circuit which a ground bounce generator is not working according to some embodiments.

Generally, the source VDD and the ground G in an ATE serve as a power supplier, which indicates that the ground noise is not provided or is small enough to be neglected between the source VDD and the ground G. FIG. 4 illustrates the time dependent voltage $V_B$ at point A in the circuit similar to that of FIG. 2, without introducing the ground bounce generator 300. As shown in FIG. 4, voltage $V_B$ is nearly zero during the operation of the ATE. In some embodiments, a ground noise smaller than 50 mV may be neglected. As a result, no ground noise is provided to the DUT 200, and the ATE fails to simulate a real application environment for testing devices.

Figure 5:
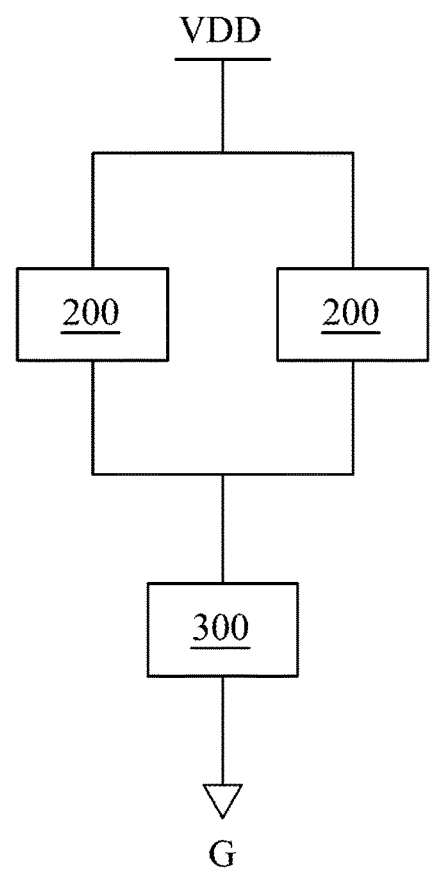
FIG. 5 is a schematic diagram of a circuit including more than one device under test and one ground bounce generator according to some embodiments of the present disclosure.

FIG. 5 illustrates a schematic diagram of a circuit similar to FIG. 2, except the circuit includes more than one DUT 200 and one ground bounce generator 300 in accordance with some embodiments of the present disclosure. As shown in FIG. 5, more than one DUT 200 may be coupled in parallel and collectively coupled in series with the ground bounce generator 300. As such, the ground noise generated by the ground bounce generator 300 is delivered to all DUTs 200 under this arrangement. Two DUTs 200 are illustrated in FIG. 5, however, a circuit including other numbers of DUTs is within the scope of the present disclosure.

Figure 6:
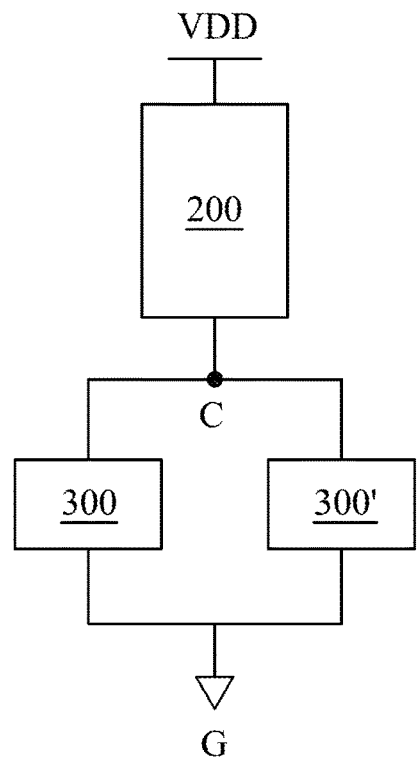
FIG. 6 is a schematic diagram of a circuit including one device under test and more than one ground bounce generator according to some embodiments of the present disclosure.
Figure 7:
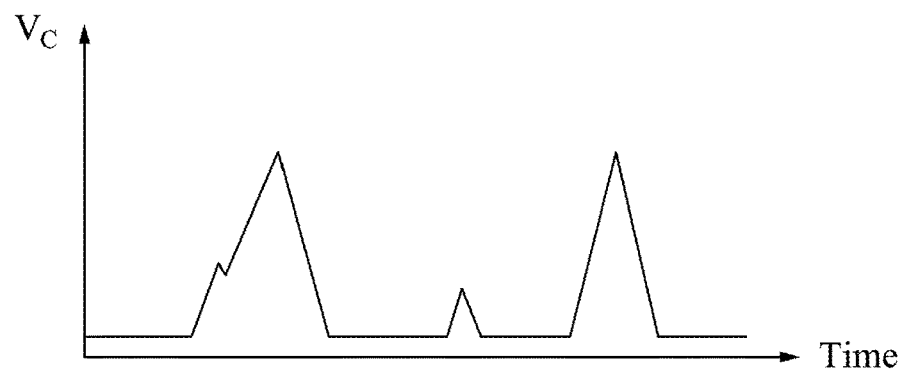
FIG. 7 is a line graph of a time dependent voltage $V_C$ in the circuit of FIG. 6.

As shown in FIG. 2 and FIG. 3A, the ground bounce generator 300 in the circuit may provide the symmetric waveforms of the artificial ground noise. To simulate the ground noise closer to the real application, a plurality of ground bounce generators may be included in a circuit and generate asymmetric waveforms of the ground noise. FIG. 6 illustrates a schematic diagram of a circuit similar to the circuit of FIG. 2, except the circuit of FIG. 6 includes one DUT 200 and more than one ground bounce generators in accordance with some embodiments of the present disclosure. More than one ground bounce generators may be coupled in parallel and collectively coupled in series with DUT 200. Two ground bounce generators 300 and 300' are illustrated in FIG. 6, however, a circuit including other number of ground bounce generators is within the scope of the present disclosure. Two ground bounce generators 300 and 300' may be the same or different ground bounce generators. In some embodiments, the ground noise generated by the ground bounce generators 300 and 300' may be different from each other. For example, the amplitude or the frequency of the ground noise from the ground bounce generators 300 and 300' may not be the same, which leads to the irregular ground noise provided to the DUT 200. FIG. 7 illustrates a time dependent voltage $V_C$ at point C in the circuit of FIG. 6 which the amplitude and the frequency of the ground noise from the ground bounce generators 300 and 300' are different. Since the amplitude and the frequency are different, the combination of the ground noise may generate the asymmetric and irregular peaks.

Figure 8:
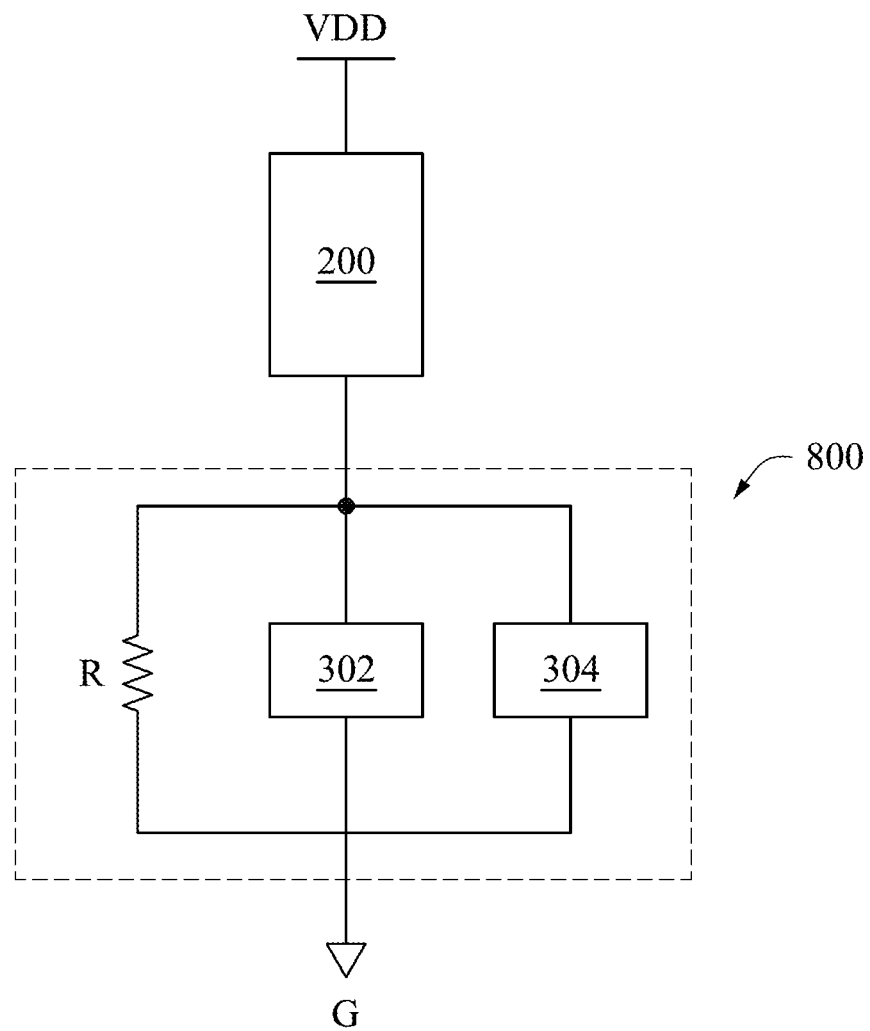
FIG. 8 is a schematic diagram of a circuit including a device under test and a ground bounce generator according to some embodiments of the present disclosure.

FIG. 8 illustrates a schematic diagram of a circuit similar to FIG. 2, except the circuit of FIG. 8 includes a DUT 200 and a ground bounce generator 800 in accordance with some embodiments of the present disclosure. The ground bounce generator 800 is similar to the ground bounce generator 300, except the ground bounce generator 800 may include more than one switch. As shown in FIG. 8, the ground bounce generator 800 includes two switches, 302 and 304. It should be noted that a ground bounce generator including other number of switches is within the scope of the present disclosure. The switches 302 and 304 may be the same type of the switch in some embodiments and may be different in other embodiments. Furthermore, the switches 302 and 304 may be controlled by the same or different systems in one ATE. With more than one switch in a ground bounce generator, the ATE is able to provide more variety of performance tests. In some embodiments, the ground bounce generator 800 may be used in other circuits such as those illustrated in FIG. 5 and FIG. 6. For example, at least one of the ground bounce generator in FIG. 6 may be the ground bounce generator 800.

With at least one ground bounce generator in an ATE as mentioned above, the ATE is able to test a testing device with a ground noise. After the testing device is coupled to the device under test in the ATE, the current and the voltage is provided through the device under test and the ground bounce generator. While the ground bounce generator is controlled by turning on and off, a group of artificial ground noises is generated that affects the device under test, which further affects the lines connected to the device under test, for example, the address input, the control input, or the data input/output. A performance result of the testing device which closer reflects application in real life is then collected by the processor of the ATE.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of testing a testing device with a ground noise, comprising:
   coupling a device under test in series between a source and a ground in an automatic test equipment;
   coupling a ground bounce generator in series between the device under test and the ground;
   coupling the testing device to the device under test;
   providing a current by the source through the device under test and the ground bounce generator;
   controlling the ground bounce generator to generate the ground noise; and
   collecting a performance result of the testing device in the automatic test equipment.

2. The method of claim 1, wherein controlling the ground bounce generator further comprising:
   forming a closed circuit on a switch in the ground bounce generator to minimize the ground noise;
   forming an open circuit on the switch in the ground bounce generator to maximize the ground noise; and
   repeating forming the closed circuit and the open circuit on the switch in the ground bounce generator to generate the ground noise.

3. The method of claim 1, wherein controlling the ground bounce generator comprises generating a voltage drop across a resistor in the ground bounce generator.

4. The method of claim 3, wherein the voltage drop equals to an amplitude of the ground noise.

5. The method of claim 1, wherein an amplitude of the ground noise is determined by a resistor in the ground bounce generator.

6. The method of claim 1, wherein an amplitude of the ground noise is between 10% to 30% of a voltage of the source.

7. The method of claim 1, wherein an amplitude of the ground noise is larger than 300 mV.

8. The method of claim 1, wherein the ground noise comprises symmetric or asymmetric waveforms.

9. The method of claim 1, wherein the ground noise comprises regular or irregular waveforms.

10. The method of claim 1, wherein the testing device comprises a dynamic random accessory memory.

11. The method of claim 1, wherein the ground noise affects an address input, a control input, or a data input/output coupled to the device under test.

* * * * *